(12) United States Patent
Bhatt et al.

(10) Patent No.: US 9,971,644 B2
(45) Date of Patent: May 15, 2018

(54) SERIAL I/O FUNCTIONAL TESTER

(71) Applicant: Intel Corporation, Santa Clara, CA (US)

(72) Inventors: Suketu U. Bhatt, Folsom, CA (US); Yuen Tat Lee, Bayan Lepas (MY); Lakshminarayana Pappu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 166 days.

(21) Appl. No.: 14/998,256

(22) Filed: Dec. 24, 2015

(65) Prior Publication Data

US 2017/0184667 A1 Jun. 29, 2017

(51) Int. Cl.
*G01R 31/28* (2006.01)
*G06F 11/10* (2006.01)
*G01R 31/317* (2006.01)

(52) U.S. Cl.
CPC .... *G06F 11/1004* (2013.01); *G01R 31/31724* (2013.01)

(58) Field of Classification Search
CPC ............... G06F 11/1076; G06F 9/3016; G06F 9/30098; G06F 9/3001; G06F 3/0619; G06F 3/0659; G06F 3/0688; G06F 11/1072; G06F 12/0246; G11C 16/10; G11C 16/30; G11C 16/3418; G11C 29/52; G11C 16/349; H04L 9/34; G11B 20/0021; G11B 2220/60; H04K 1/06
See application file for complete search history.

(56) References Cited

U.S. PATENT DOCUMENTS

| | | | | |
|---|---|---|---|---|
| 6,009,550 | A * | 12/1999 | Gosula | G11B 20/1866 360/49 |
| 6,101,620 | A * | 8/2000 | Ranganathan | G11C 29/20 345/519 |
| 6,253,349 | B1 * | 6/2001 | Maeda | G06F 11/10 714/799 |
| 2003/0172177 | A1 | 9/2003 | Kersley et al. | |
| 2003/0214317 | A1 | 11/2003 | Kirloskar et al. | |
| 2008/0144618 | A1 | 6/2008 | Frishberg | |
| 2008/0151618 | A1 * | 6/2008 | Sharon | G06F 11/1068 365/185.02 |
| 2009/0024892 | A1 * | 1/2009 | Bussa | G06F 11/263 714/738 |
| 2009/0292968 | A1 * | 11/2009 | Cypher | G06F 11/10 714/755 |

(Continued)

OTHER PUBLICATIONS

International Search Report and Written Opinion issued in PCT Application No. PCT/US2016/063781, dated Mar. 13, 2017, 11 pages.

*Primary Examiner* — Guerrier Merant
(74) *Attorney, Agent, or Firm* — Grossman, Tucker, Perreault & Pfleger, PLLC

(57) ABSTRACT

One embodiment provides an apparatus. The apparatus includes a functional test controller. The functional test controller includes controller logic to receive communication protocol-specific data comprising a packet header from a tester; a protocol buffer to store the packet header; and a pseudorandom bit sequence (PRBS) generator to generate a PRBS. The controller logic is to combine the packet header and the PRBS into a packet and to provide the packet to an input/output (I/O) controller under test.

21 Claims, 4 Drawing Sheets

(56) References Cited

U.S. PATENT DOCUMENTS

| | | | |
|---|---|---|---|
| 2010/0299585 A1* | 11/2010 | Forest | H04L 1/0061 |
| | | | 714/807 |
| 2010/0306619 A1* | 12/2010 | Yang | G06F 11/1072 |
| | | | 714/758 |
| 2011/0035645 A1* | 2/2011 | Yang | G06F 11/1072 |
| | | | 714/763 |
| 2012/0226963 A1* | 9/2012 | Bivens | G11C 29/42 |
| | | | 714/773 |
| 2013/0016736 A1 | 1/2013 | Parnaby | |
| 2013/0101111 A1* | 4/2013 | Sharon | G11B 20/0021 |
| | | | 380/28 |
| 2013/0283115 A1* | 10/2013 | Sazeides | G06F 11/1008 |
| | | | 714/752 |
| 2014/0324378 A1 | 10/2014 | Elston et al. | |
| 2015/0193163 A1* | 7/2015 | Mun | G11C 16/10 |
| | | | 711/103 |
| 2015/0293173 A1* | 10/2015 | Tsuboi | G01R 31/3177 |
| | | | 714/727 |

* cited by examiner

SERIAL I/O FUNCTIONAL TESTER

FIELD

The present disclosure relates to a functional tester, in particular to, serial input/output (I/O) functional tester.

BACKGROUND

Functional testing of electronic components, including, for example, processors, I/O controllers, systems-on-a-chip, and/or systems that include such electronic components, as part of a manufacturing process, is configured to detect faulty components and to reduce the likelihood that defective components and/or systems reach an end-user. Automated Test Equipment (ATE) may be used to test such electronic components.

A serial I/O controller is one such electronic component that may benefit from functional testing. A serial I/O controller is configured to couple a processor (e.g., processing unit) and one or more peripheral device(s). Communication between the serial I/O controller and the peripheral device(s) may comply and/or be compatible with one or more communication protocols, e.g., Universal Serial Bus (USB), Peripheral Component Interconnect Express (PCIe), Camera Serial Interface (CSI), Universal Flash Storage (UFS), Serial AT Attachment (SATA), etc.

BRIEF DESCRIPTION OF DRAWINGS

Features and advantages of the claimed subject matter will be apparent from the following detailed description of embodiments consistent therewith, which description should be considered with reference to the accompanying drawings, wherein:

Figure 1:
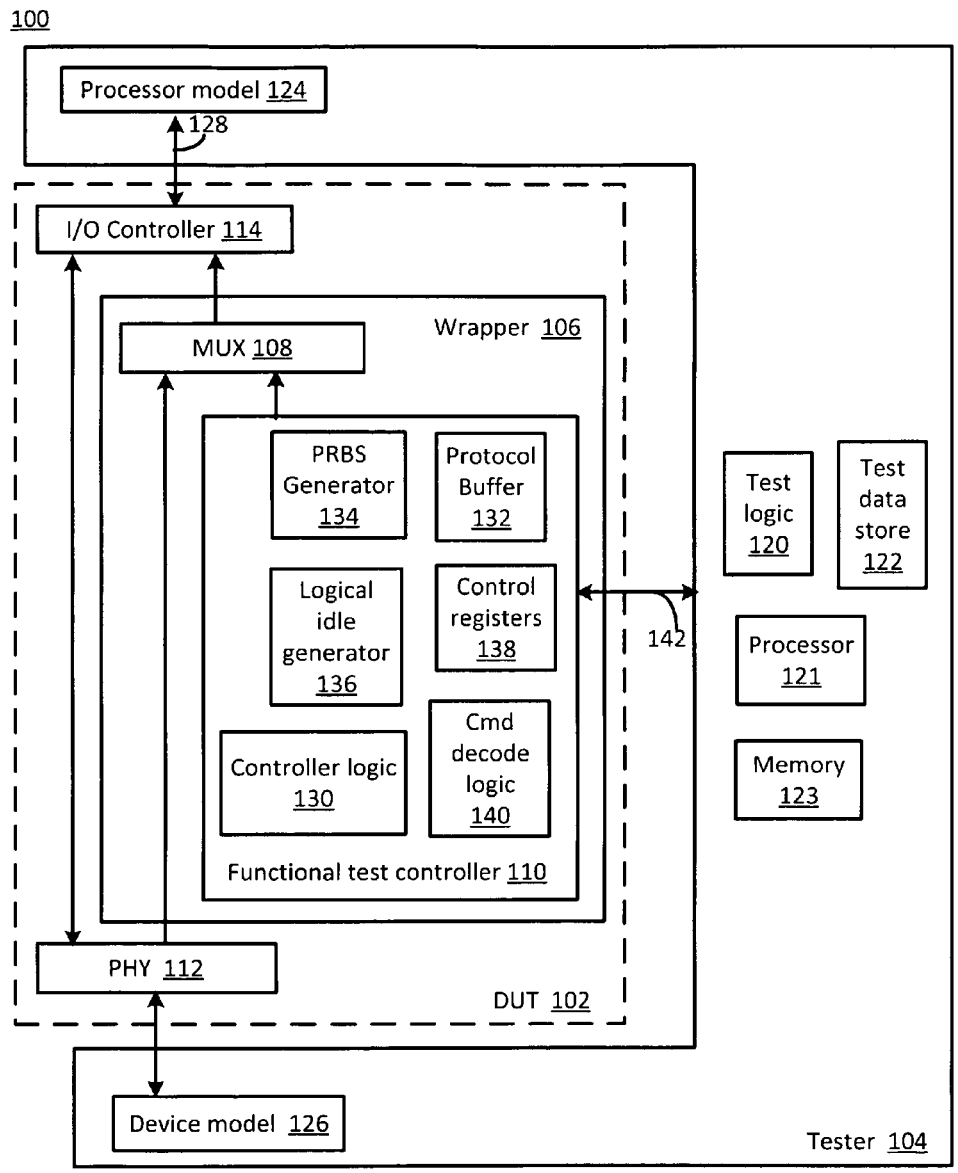
FIG. 1 illustrates a functional block diagram of a serial I/O functional test system consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

"High speed" serial I/O controllers present some challenges to functional testing. As used herein, "high speed" corresponds to a bit rate greater than or equal to 500 Megabits per second (Mbps). In order to test a receive functionality of a high speed serial I/O controller, packetized test data may be applied to the I/O controller. The packetized test data may be produced by the ATE (automated test equipment, i.e., tester) and provided to a device under test (DUT) at a line rate which, for high speed serial I/O controllers, may exceed the capabilities of some ATEs. High speed ATEs may be utilized but are typically more expensive than lower speed ATEs. An alternative to providing the packetized test data from the ATE is to produce the packets "on-die", i.e., built-in self-test (BIST). Because of the variety of communication protocols, producing protocol-compliant packets for a plurality of communication protocols may result in substantial additional complexity on-die.

Generally, this disclosure relates to a serial input/output (I/O) functional tester. An apparatus, method and/or system are configured to implement communication protocol-specific functionality on the tester (i.e., ATE) and to generate test data (e.g., pseudorandom bit sequence (PRBS)) on-die. The apparatus, method and/or system may include test logic resident on the tester and a functional test controller on-die. The test logic is configured to generate communication protocol-specific data and to provide the communication protocol-specific data to the functional test controller. The functional test controller is configured to receive the communication protocol-specific data, e.g., a link management packet, packet header information, checksum(s) and/or cyclic redundancy checks (CRCs) from the ATE test logic. The functional test controller is further configured to generate a PRBS, combine the packet header information (i.e., header) and the PRBS (i.e., payload) and provide the packetized pseudorandom data to an associated I/O controller that is under test.

A data rate and/or bandwidth of the ATE may then be less than the data rate of the packetized pseudorandom data provided to the I/O controller. In other words, for most serial I/O communication protocols, a size of a header is less than a size of an associated payload. For example, for a USB packet, the header may contain 16 bytes (including a two-byte CRC and a two-byte link control word) and a high speed payload may contain up to 1024 bytes. Thus, a packet header may correspond to a fraction of a packet payload.

Implementing protocol-specific functionality on the tester allows the functional test controller to receive protocol-specific information, to generate protocol-independent information and to combine the protocol-specific data, e.g., packet header, with the protocol-independent information, e.g., payload. In other words, the functional test controller may generate a PRBS to be utilized for test packet payloads independent of the ultimate communication protocol. The functional test controller is configured to be coupled to the serial I/O controller and may thus be implemented with any I/O controller.

Thus, functional testing of high speed serial I/O controllers may be performed utilizing a relatively lower bandwidth ATE. A plurality of communication protocols may be implemented using a same on-die functional test controller since protocol-specific data may be provided by the ATE (i.e., tester).

FIG. 1 illustrates a functional block diagram of a serial I/O functional test system consistent with several embodiments of the present disclosure. System 100 includes a device under test (DUT) 102 and a tester 104. For example, tester 104 may correspond to an ATE. DUT 102 includes a functional test controller 110, a physical layer interface (PHY) 112 and an I/O controller 114. Tester 104 includes test logic 120, a test data store 122, a processor model 124, a device model 126, a processor 121 and memory 123. Processor 121 is configured to perform operations of tester 104. Memory 123 is configured to store test data 122 and may be configured to store test logic 120.

Test logic 120 is configured to provide commands and communication protocol-specific data to functional test controller 110. Test logic 120 is configured to generate selected protocol-specific data, generate a PRBS, generate a CRC based, at least in part, on the communication protocol and based, at least in part, on the PRBS. Test logic 120 is further configured to provide the communication protocol-specific data and the CRC to the functional test controller 110.

I/O controller 114 is coupled to processor model 124 by an interconnect fabric 128 and tester 104 is coupled to functional test controller 110 by a test fabric 142. Interconnect fabric 128 is configured to carry packets. Test fabric 142 is configured to carry one or more of packets, communication protocol-specific data, data and/or commands.

PHY 112 is configured to physically couple to a peripheral device. During functional testing, PHY 112 is configured to couple to device model 126. Device model 126 is configured to model a peripheral device. During operation, e.g., when not testing, PHY 112 is configured to receive an analog input signal that may include data. Processor model 124 is configured to model a processor (and/or processing unit) coupled to I/O controller 114. In operation, processor model 124 functionality may correspond to an actual processor. Thus, processor model 124 and device model 126 are configured to model a processor and a peripheral device during functional testing of I/O controller 114 and interconnect fabric 128.

I/O controller 114 is configured to receive inputs from, and provide output to, device model 126 via PHY 112. I/O controller 114 is further configured to receive inputs from and provide output to processor model 124 via interconnect fabric 128. During functional testing, I/O controller 114 is configured to receive input from functional test controller 110. For example, DUT 102 may include wrapper 106 that includes a multiplexer (MUX) 108. MUX 108 may be configured to select PHY 112 during operation and/or testing (if any) of transmit (i.e., outbound operations) functionality of I/O controller 114 or to select the functional test controller 110 during receive (i.e., inbound) testing.

Functional test controller 110 includes controller logic 130, protocol buffer 132 and pseudorandom bit sequence (PRBS) generator 134. Functional test controller 110 may include a logical idle generator 136. Functional test controller 110 may further include one or more control registers 138 and/or command decode logic 140.

During functional testing, functional test controller 110 is coupled to tester 104 via test fabric 142. DUT 102 may also be coupled to processor model 124 via interface fabric 128 and device model 126 via PHY 112. Functional testing operations may test receive functionality (i.e., inbound operations) of I/O controller 114 and/or interface fabric 128. Transmit functionality (i.e., outbound operations) of interconnect fabric 128, I/O controller 114 and/or PHY 112 may be tested using, for example, multiple input shift registers (MISRs).

During receive functional testing, functional test controller 110 is configured to receive communication protocol-specific data, e.g., packet header information, link management information, checksum(s) and/or cyclic redundancy checks (CRCs) from test logic 120. Functional test controller 110 may be further configured to receive one or more commands and/or test vectors from test logic 120 and/or to provide data output to test logic 120, via test fabric 142. Link management information, e.g., packets, may include, but are not limited to, training sequences, credit exchange packets, acknowledgement (ACK) and/or non-acknowledgement (NACK) handshakes, isochronous time management packets (ITPs), etc. Such packets are communication protocol-specified with protocol-defined structures that may not be randomized. Link management packets may be utilized to manage traffic between a processor and a peripheral device. The communication protocol-specific data may comply and/or be compatible with one or more packet-based communication protocols and/or specifications. The packet-based communication protocols may include, but are not limited to, Universal Serial Bus (USB), Peripheral Component Interconnect Express (PCIe), Camera Serial Interface (CSI), Universal Flash Storage (UFS) and/or Serial AT Attachment (SATA) communication protocols and/or specifications, as described herein.

I/O controller 114 may be configured to comply and/or be compatible with a selected communication protocol. I/O controller 114 is configured to provide an interface between interconnect fabric 128 and PHY 112 and ultimately a peripheral device that may be coupled to PHY 112. Interconnect fabric 128 may be independent of the selected communication protocol while I/O controller 114 is specific to the selected communication protocol. In other words, any I/O controller is configured to be compatible with interconnect fabric 128 while each I/O controller is configured to be compatible with a respective communication protocol.

During functional testing, operation of functional test controller 110 may be managed by controller logic 130. Controller logic 130 is configured to select protocol buffer 132, PRBS generator 134 or logical idle generator 136 to provide output to I/O controller 114 via MUX 108. Protocol buffer 132 may be configured to store a plurality of packet headers received from test logic 120. Protocol buffer 132 may be further configured to store checksums and/or CRC(s). For example, the protocol buffer 132 may be configured as a first in-first out (FIFO) buffer. Command decode logic 140 may be configured to decode commands received from test logic 140 and to provide decoded command information to controller logic 130. For example, commands may include a number of clock cycles to be used for generating a payload, related to a number of pseudorandom bits to be included in the payload.

Control registers 138 may be configured to store checksums and/or CRCs, as described herein. Control registers 138 may be utilized, for example, to program an initial seed for PRBS generator 134. Control registers 138 may define a state of one or more protocol specific static signals utilized by control logic 130 to drive I/O controller 114.

PRBS generator 134 is configured to generate a pseudorandom bit sequence. The pseudorandom bit sequence may be generated based, at least in part, on a seed value. The seed value may be stored to control registers 138 and to test data store 122. Test logic 120 may be similarly configured to generate a PRBS based, at least in part, on the seed value. Test logic 120 may be configured to determine the PRBS, a priori, and to store the PRBS to test data store 122. For example, PRBS generator 134 may correspond to a linear feedback shift register (LFSR). Each of a plurality of PRBSs may be combined with a respective packet header from the plurality of headers stored in protocol buffer 132 and provided to I/O controller 114. The combining and providing may be managed by controller logic 130. Test logic 120 is configured to generate the plurality of corresponding PRBSs using the same seed. Test logic 120 is further configured to determine at least one CRC based, at least in part, on at least one determined PRBS.

Determination of a CRC may vary with communication protocol. Test logic 120 is configured to provide the determined CRC(s) to functional test controller 110. Thus, operation of functional test controller 110 may remain independent of the communication protocol except for combining packet headers that correspond to a selected communication protocol with PRBS portions to form packets. In other words, bandwidth intensive operations, e.g., generating test data (i.e., PBRS), may be performed by functional test controller 110 and protocol-specific operations may be performed by tester 104 and test logic 120.

Logical idle generator 136 is configured to generate logical idle data for provision to I/O controller 114 when packets are not being provided to I/O controller 114. The logical idle data is configured to allow synchronization to be maintained between I/O controller 114 and functional test controller 110. In other words, rather than the test logic 120 providing logical idle information and consuming associated bandwidth, logical idle generator 136 is configured to provide corresponding logical idle data. For example, logical idle data may be provided to I/O controller 114 while packet header information is being loaded to protocol buffer 132. Thus, when packets are not being provided to I/O controller 114 by functional test controller 110, logical idle data may be provided by functional test controller (e.g., logical idle generator 136) and I/O controller 114 may thus maintain the communication link and associated synchronization between the I/O controller 114 and functional test controller 110.

In an embodiment, functional test controller 110 may be configured to provide looping support for serial I/O functional test system 100. Looping support corresponds to providing back to back packets without logical idles between consecutive packets. For example, looping may be utilized for training sequences, i.e., data packets sent continuously without logical idles. The looping support may be provided by functional test controller 110 without providing an additional load on tester 104 and may thus not be constrained by bandwidth limitations that may be associated with tester 104 and test logic 120.

Thus, serial I/O functional test system 100 is configured to implement protocol-specific functionality on tester 104 and to generate test data, e.g., a PRBS, on-die, i.e., utilizing functional test controller 110. Functional test controller 110 is configured to combine communication protocol-specific packet headers from tester 104 with the test data generated on-die. This hybrid approach is configured to reduce a bandwidth associated with tester 104 while providing high speed functional test capability. The serial I/O functional test system 100 is configured to support functional testing for a variety of communication protocols with protocol-independent data generated by functional test controller 110.

Figure 2:
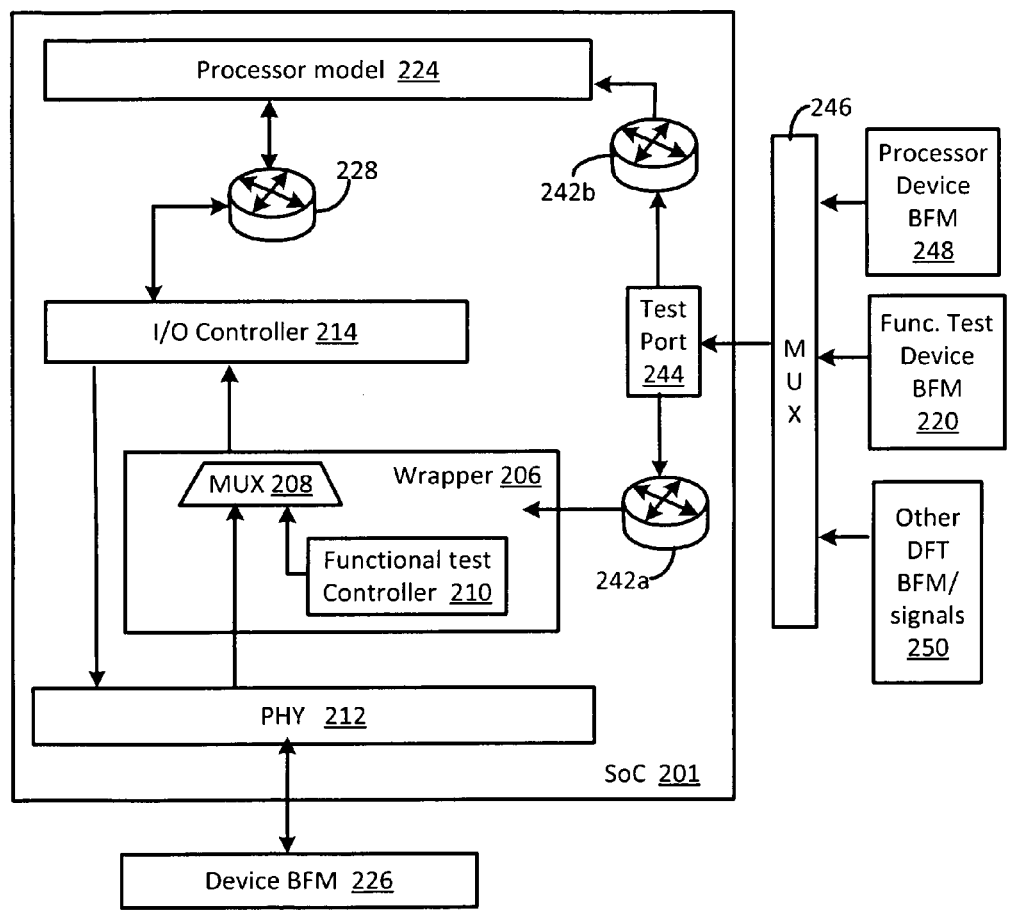
FIG. 2 illustrates a simulation diagram of one example serial I/O functional test system.

FIG. 2 illustrates a simulation diagram 200 of one example serial I/O functional test system. Simulation diagram 200 corresponds to serial I/O functional test system 100 of FIG. 1. Simulation diagram 200 includes a system-on-a-chip (SoC) 201, a functional test device BFM (bus functional model) 220, a device BFM 226, a MUX 246, a processor device BFM 248 and other DFT (design for test) BFM/signals 250. Simulation diagram 200 is configured to illustrate a test vector generation view, i.e., a simulation view, of one example of a serial I/O functional test system. A bus functional model (BFM) is configured to describe behavior of a device at an interface level, i.e., without modeling internal operation of the device. SoC 201 includes a PHY 212, wrapper 206, I/O controller 214, interconnect fabric 228, a processor model 224, test fabric portions 242a, 242b (collectively 242) and a test port 244. Wrapper 206 includes a MUX 208 and a functional test controller 210.

During functional testing, as illustrated by simulation diagram 200, a peripheral device may be simulated by device BFM 226 and a processor may be simulated by processor model 224. The processor model 224 is coupled to the I/O controller 214 by interconnect fabric 228. Outbound communication between I/O controller 214 and device BFM 226 is via PHY 212. Inbound communication, i.e. received communication, to I/O controller 214 may be from PHY 212 (e.g., "normal" operation) or from functional test controller 210 during testing. Mux 208 is configured to select either PHY 212 or functional test controller 210. Mux 208 may be controlled by functional test device BFM 220 and/or other DFT BFM/signals 250. Test fabric 242 is configured to couple test port 244 to processor model 224 and/or wrapper 206. Test port 244 is selectably coupled to processor device BFM 248, functional test device BFM 220 or other DFT BFM/signals 250 by MUX 246.

In the simulation environment 220, functional test controller 210 is configured to generate a PRBS, i.e., payload data, and functional test device BFM 220 is configured to provide communication protocol-specific data to functional test controller 210. Thus, bandwidth intensive data may be generated by functional test controller 210 and communication protocol-specific information may be provided by a tester, e.g., functional test device BFM 220, as described herein. For example, functional test controller 210 may correspond to functional test controller 110 of FIG. 1 and functional test device BFM 220 may correspond to test logic 120.

Figure 3:
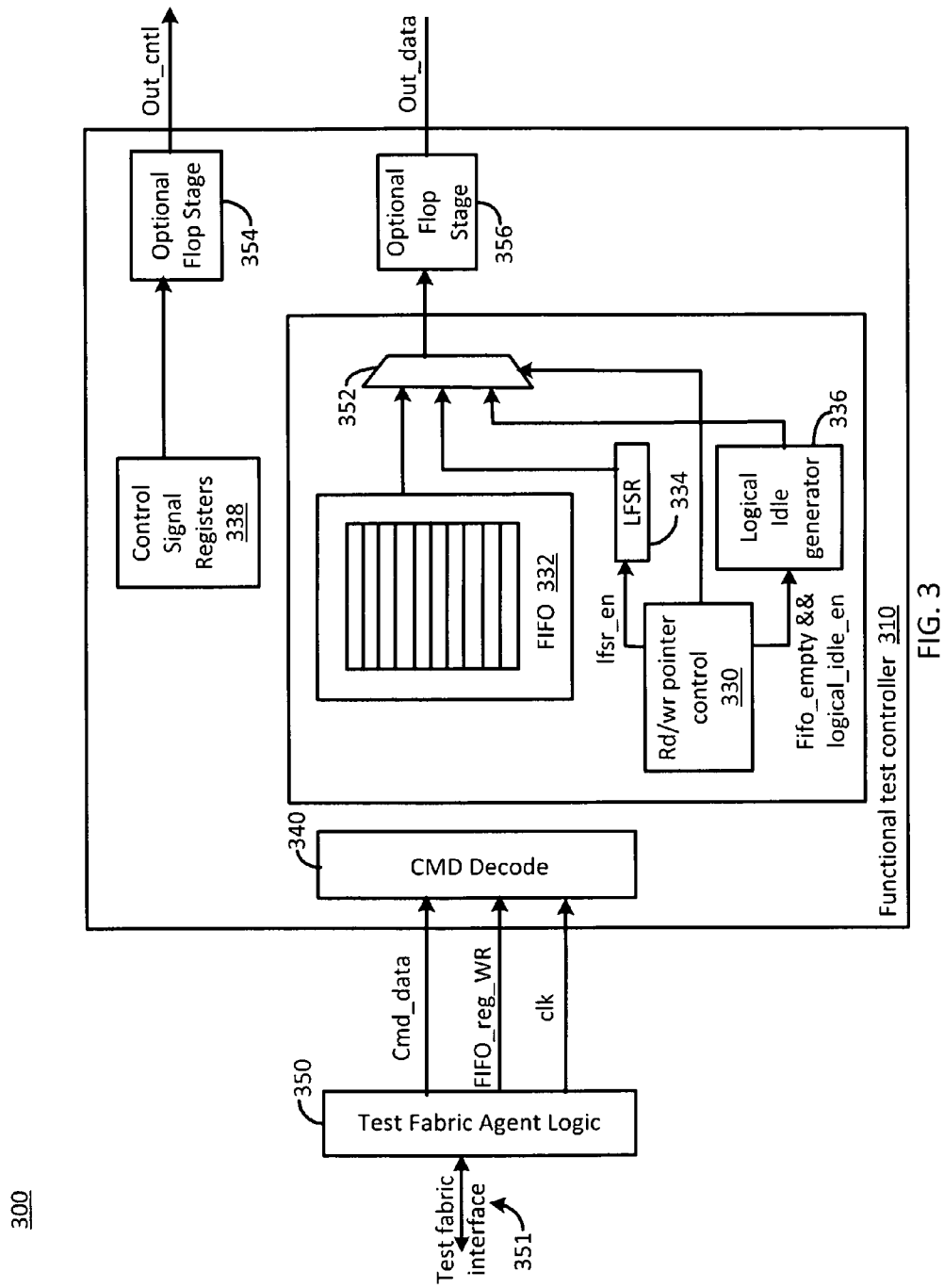
FIG. 3 illustrates one example functional block diagram of a functional test controller, test fabric agent logic and test fabric interface.

FIG. 3 illustrates one example functional block diagram 300 of a functional test controller 310, test fabric agent logic 350 and test fabric interface 351. Functional test controller 310 includes command decode logic 340, FIFO 332, read/write pointer control logic 330, LFSR 334, logical idle generator 336, MUX 352, control signal registers 338 and optional flop stages 354, 356. Optional flop stages 354, 356 are configured to facilitate achieving appropriate timing for test data injected by test controller 310. Test fabric interface 351 and test fabric agent logic 350 are configured to couple functional test controller 310 to a tester, e.g., tester 104 of FIG. 1. Functional test controller 310, e.g., command decode logic 340, are configured to receive commands, cmd_data, communication protocol-specific data, FIFO_reg_WR and a clock signal, clk, from test fabric agent logic 350. FIFO 332 is one example of protocol buffer 132. LFSR 334 is one example of PRBS generator 134.

Read/write pointer control logic 330 is one example of controller logic 130. Read/write pointer control logic 330 is configured to select output data, out_data, e.g., packet header, payload data and/or logical idle data, for functional test controller 310. The output data may be provided to, for example, an I/O controller, e.g., I/O controller 114. Read/write pointer control logic 330 is configured to control LFSR 334, logical idle generator 336 and MUX 352 in order to select the output data. Control signals, out_cntl, from control signal registers 338 may be output from functional test controller 310 to the I/O controller.

Thus, functional block diagram 300 illustrates one example of a functional test controller, a test fabric interface configured to couple to a tester and output data and control signals to be provided to an I/O controller.

Thus, a serial I/O functional test system may implement protocol-specific functionality on a tester and may generate test data on-die. Thus, bandwidth-intensive data may be generated by a functional test controller, on-die, and communication protocol-specific data may be generated by the tester. Communication protocol-specific data, including, for example, packet headers and at least one CRC may be provided to the functional test controller. The packet headers may be combined with the bandwidth-intensive data by the functional test controller. In this manner, the tester may be configured to manage complexity and the functional test controller may be configured to provide speed.

Figure 4:
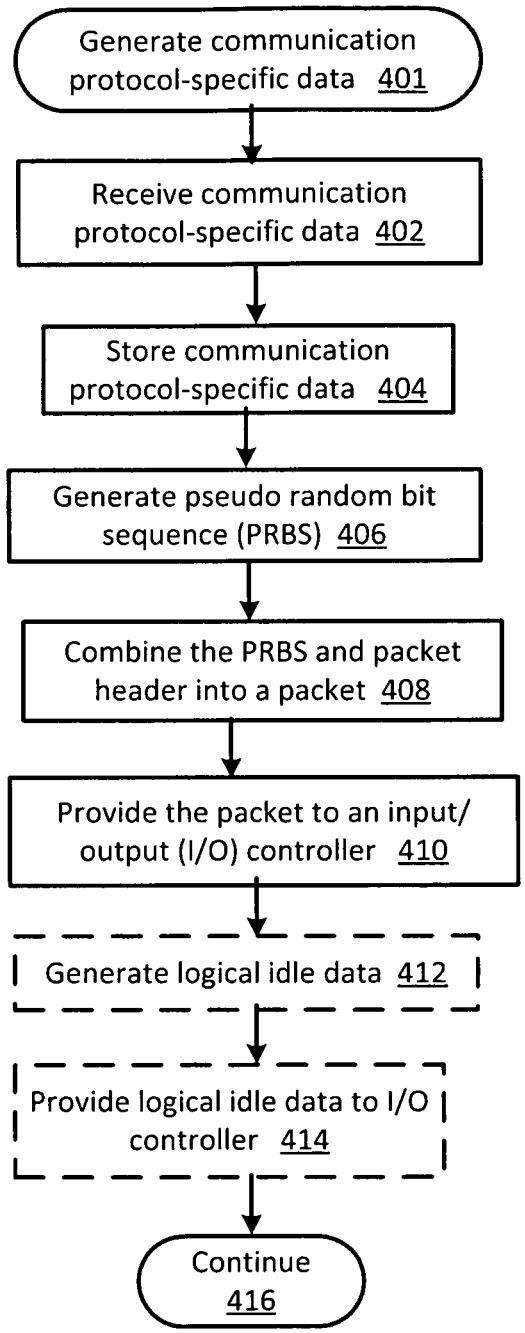
FIG. 4 is a flowchart of serial I/O functional test operations according to various embodiments of the present disclosure.

FIG. 4 is a flowchart 400 of serial I/O functional test operations according to various embodiments of the present disclosure. In particular, the flowchart 400 illustrates generating test packets and providing the packets to an I/O controller. The operations may be performed, for example, by functional test controller 110 and test logic 120 of FIG. 1.

Operations of this embodiment may begin with communication protocol-specific data generated at operation 401. For example, the communication protocol-specific data may be generated by test logic resident on a tester, e.g. test logic 120 and tester 104. The communication protocol-specific data may be received at operation 402. For example, the communication protocol-specific data may be received by a functional test controller and/or controller logic, e.g., functional test controller 110 and/or controller logic 130 of FIG. 1. The communication protocol-specific data may be stored at operation 404. For example, the communication protocol-specific data may be stored to a protocol buffer included in the functional test controller, e.g., protocol buffer 132 and functional test controller 110. A PRBS may be generated at operation 406. For example, the PRBS may be generated by the functional test controller. The PRBS and a packet header may be combined into a packet at operation 408. For example, the packetizing may be performed by the functional test controller. The packet may be provided to an I/O controller at operation 410. In some embodiments, logical idle data may be generated at operation 412. For example, the logical idle data may be generated by the functional test controller. The logical idle data may be provided to I/O controller at operation 414. Program flow may continue in operation 416.

Thus, communication protocol-specific data may be generated by test logic resident on a tester and provided to a functional test controller. Payload data, e.g., at least a portion of a PRBS, may be generated by a functional test controller that is on-die. The communication protocol-specific data may be combined with the payload data by the functional test controller and provided to an I/O controller under test.

While the flowchart of FIG. 4 illustrates operations according various embodiments, it is to be understood that not all of the operations depicted in FIG. 4 are necessary for other embodiments. In addition, it is fully contemplated herein that in other embodiments of the present disclosure, the operations depicted in FIG. 4 and/or other operations described herein may be combined in a manner not specifically shown in any of the drawings, and such embodiments may include less or more operations than are illustrated in FIG. 4. Thus, claims directed to features and/or operations that are not exactly shown in one drawing are deemed within the scope and content of the present disclosure.

Thus, an apparatus, method and/or system are configured to implement protocol-specific functionality on automated test equipment (i.e., tester) and to generate test data (e.g., PRBS) on-die. The apparatus, method and/or system may include test logic resident on the tester and a functional test controller on-die. The ATE test logic is configured to generate communication protocol-specific data and to provide the data to the functional test controller. The functional test controller is configured to receive communication protocol-specific data, e.g., packet header information, checksum(s) and/or CRCs from the ATE test logic. The functional test controller is further configured to generate a PRBS, combine the packet header information (i.e., header) and the PRBS (i.e., payload) and provide the packetized pseudorandom data to an associated I/O controller, for testing.

A data rate and/or bandwidth of the ATE may then be less than the data rate of the packetized pseudorandom data provided to the I/O controller. Implementing protocol-specific functionality on the tester allows the functional test controller to receive protocol-specific information, to generate protocol-independent information and to combine the protocol-specific data with the protocol-independent information. The apparatus, system and/or method may be implemented with any serial I/O controller. Thus, functional testing of high speed serial I/O controllers may be performed utilizing a relatively lower bandwidth ATE and may implement a plurality of communication protocols using a same on-die functional test controller.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

The foregoing provides example system architectures and methodologies, however, modifications to the present disclosure are possible. The processor may include one or more processor cores and may be configured to execute system software. System software may include, for example, an operating system. Device memory may include I/O memory buffers configured to store one or more data packets that are to be transmitted by, or received by, a network interface.

The operating system (OS) may be configured to manage system resources and control tasks that are run on, e.g., tester 104. For example, the OS may be implemented using Microsoft® Windows®, HP-UX®, Linux®, or UNIX®, although other operating systems may be used. In another example, the OS may be implemented using Android™, iOS, Windows Phone® or BlackBerry®. In some embodiments, the OS may be replaced by a virtual machine monitor (or hypervisor) which may provide a layer of abstraction for underlying hardware to various operating systems (virtual machines) running on one or more processing units. The operating system and/or virtual machine may implement a protocol stack. A protocol stack may execute one or more programs to process packets. An example of a protocol stack is a TCP/IP (Transport Control Protocol/Internet Protocol) protocol stack comprising one or more programs for handling (e.g., processing or generating) packets to transmit and/or receive over a network.

USB (Universal Serial Bus) may comply or be compatible with Universal Serial Bus Specification, Revision 2.0, published by the Universal Serial Bus organization, Apr. 27, 2000, and/or later versions of this specification, for example, Universal Serial Bus 3.0 Specification (including errata and ECNs through May 1, 2011) and/or Universal Serial Bus Specification, Revision 3.1, published Jul. 26, 2013.

PCIe (Peripheral Component Interconnect Express) may comply or be compatible with PCI Express 3.0 Base specification, Revision 3.0, published by Peripheral Component Interconnect Special Interest Group (PCI-SIG), November 2010, and/or later and/or related versions of this specification.

CSI (Camera Serial Interface) may comply or be compatible with Camera Serial Interface (CSI) specification, CSI-2 v1.0 interface specification, released in 2005, by the MIPI® (Mobile Industry Processor Interface) Alliance and/or later versions of this specification, for example, CSI-3 interface specification released in 2012, and/or later and/or related versions of these specifications.

UFS (Universal Flash) may comply and/or be compatible with Joint Electron Device Engineering Council (JEDEC) specification number JESD220B, titled: Universal Flash Storage v2.0 specification, published September 2013 by JEDEC Solid State Technology Association, and/or earlier and/or later versions of this specification.

SATA (Serial AT Attachment) may comply and/or be compatible with SATA (Serial ATA (Advanced Technology Attachment)) specification, titled: Serial ATA Specification, Revision 3.2, released August 2013, by SATA International Organization (SATA-IO), Beaverton, Oreg., and/or earlier and/or later versions of this specification.

Memory 123 may include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may include other and/or later-developed types of computer-readable memory.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog—Unified Hardware Design, Specification, and Verification Language, dated Jul. 7, 2011; IEEE Std1800™-2012: IEEE Standard for SystemVerilog-Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

Thus, an apparatus, method and/or system are configured to implement protocol-specific functionality on automated test equipment (ATE) and to generate test data (e.g., PRBS) on-die. The apparatus, method and/or system may include test logic resident on the ATE and a functional test controller on-die. The ATE test logic is configured to generate communication protocol-specific data and to provide the data to the functional test controller. The functional test controller is configured to receive the communication protocol-specific data, e.g., packet header information, checksum(s) and/or CRCs from the ATE test logic. The functional test controller is further configured to generate a PRBS, combine the packet header information (i.e., header) and the PRBS (i.e., payload) and provide the packetized pseudorandom data to an associated I/O controller under test.

EXAMPLES

Examples of the present disclosure include subject material such as a method, means for performing acts of the method, a device, or of an apparatus or system related to client traffic management, as discussed below.

Example 1

According to this example, there is provided an apparatus. The apparatus includes a functional test controller. The functional test controller includes controller logic to receive communication protocol-specific data including a packet header from a tester, a protocol buffer to store the packet header, and a pseudorandom bit sequence (PRBS) generator to generate a PRBS, the controller logic to combine the packet header and the PRBS into a packet and to provide the packet to an input/output (I/O) controller under test.

Example 2

This example includes the elements of example 1, wherein the communication protocol is selected from the group including a Universal Serial Bus (USB) protocol, a Peripheral Component Interconnect Express (PCIe) protocol, a Camera Serial Interface (CSI) protocol, a Universal Flash Storage (UFS) protocol and a Serial AT Attachment (SATA) protocol.

Example 3

This example includes the elements of example 1, wherein the PRBS generator is a linear feedback shift register (LFSR).

Example 4

This example includes the elements of example 1, wherein the functional test controller further includes a logical idle generator to generate logical idle data for provision to the I/O controller when packets are not being provided to the I/O controller.

Example 5

This example includes the elements according to any one of examples 1 to 4, wherein the controller logic is to provide back to back packets to the I/O controller without logical idles between consecutive packets.

Example 6

This example includes the elements according to any one of examples 1 to 4, wherein the protocol buffer is a first in-first out (FIFO) buffer.

Example 7

This example includes the elements according to any one of examples 1 to 4, herein the communication protocol-specific data further includes at least one of a checksum and/or a cyclic redundancy check (CRC).

Example 8

This example includes the elements according to any one of examples 1 to 4, wherein the functional test controller is on die.

Example 9

This example includes the elements of example 7, wherein the communication protocol-specific data further includes link management information.

Example 10

This example includes the elements of example 9, wherein the link management information includes one or more of a training sequence, a credit exchange packet, an acknowledgement (ACK) and/or a non-acknowledgement (NACK) handshake and/or an isochronous time management packet (ITP).

Example 11

This example includes the elements according to any one of examples 1 to 4, wherein the controller logic is to provide a plurality of packets to the I/O controller under test at a rate greater than or equal to 500 megabits per second (Mbps).

Example 12

This example includes the elements according to any one of examples 1 to 4, wherein the functional test controller further includes a control register configured to program an initial seed for the PRBS generator.

Example 13

This example includes the elements according to any one of examples 1 to 4, further including a multiplexer to select the functional test controller during receive testing or to select a physical layer interface (PHY).

Example 14

According to this example, there is provided a method. The method includes receiving, by controller logic, the communication protocol-specific data from a tester, the communication protocol-specific data including a packet header. The method further includes storing, by a protocol buffer, the packet header, generating, by a pseudorandom bit sequence (PRBS) generator, a PRBS, combining, by the controller logic, the packet header and the PRBS into a packet, and providing, by the controller logic, the packet to an input/output (I/O) controller under test.

Example 15

This example includes the elements of example 14, wherein the communication protocol is selected from the group including a Universal Serial Bus (USB) protocol, a Peripheral Component Interconnect Express (PCIe) protocol, a Camera Serial Interface (CSI) protocol, a Universal Flash Storage (UFS) protocol and a Serial AT Attachment (SATA) protocol.

Example 16

This example includes the elements of example 14, wherein the PRBS generator is a linear feedback shift register (LFSR).

Example 17

This example includes the elements of example 14, further including generating, by a logical idle generator, logical idle data for provision to the I/O controller when packets are not being provided to the I/O controller.

Example 18

This example includes the elements of example 14, further including providing, by the controller logic, back to back packets to the I/O controller without logical idles between consecutive packets.

Example 19

This example includes the elements of example 14, wherein the protocol buffer is a first in-first out (FIFO) buffer.

Example 20

This example includes the elements of example 14, wherein the communication protocol-specific data further includes at least one of a checksum and/or a cyclic redundancy check (CRC).

Example 21

This example includes the elements of example 14, further including providing, by test logic, the communication protocol specific data to a functional test controller on die.

Example 22

This example includes the elements of example 20, wherein the communication protocol-specific data further includes link management information.

Example 23

This example includes the elements of example 22, wherein the link management information includes one or more of a training sequence, a credit exchange packet, an acknowledgement (ACK) and/or a non-acknowledgement (NACK) handshake and/or an isochronous time management packet (ITP).

Example 24

This example includes the elements of example 14, further including providing, by the controller logic, a plurality of packets to the I/O controller under test at a rate greater than or equal to 500 megabits per second (Mbps).

Example 25

This example includes the elements of example 14, further including programming, by a control register, an initial seed for the PRBS generator.

Example 26

This example includes the elements of example 14, further including selecting, by a multiplexer, the functional test controller during receive testing or a physical layer interface (PHY).

Example 27

According to this example, there is provided a system. The system includes a functional test controller, and a tester. The tester includes a processor, a memory including test data, and test logic to provide communication protocol-specific data including a packet header to the functional test controller. The functional test controller includes controller logic to receive the communication protocol-specific data from the tester, a protocol buffer to store the packet header, and a pseudorandom bit sequence (PRBS) generator to generate a PRBS. The controller logic is to combine the packet header and the PRBS into a packet and to provide the packet to an input/output (I/O) controller under test.

Example 28

This example includes the elements of example 27, wherein the communication protocol is selected from the group including a Universal Serial Bus (USB) protocol, a Peripheral Component Interconnect Express (PCIe) protocol, a Camera Serial Interface (CSI) protocol, a Universal Flash Storage (UFS) protocol and a Serial AT Attachment (SATA) protocol.

Example 29

This example includes the elements of example 27, wherein the PRBS generator is a linear feedback shift register (LFSR).

Example 30

This example includes the elements of example 27, wherein the functional test controller further includes a logical idle generator to generate logical idle data for provision to the I/O controller when packets are not being provided to the I/O controller.

Example 31

This example includes the elements according to any one of examples 27 to 30, wherein the controller logic is to provide back to back packets to the I/O controller without logical idles between consecutive packets.

Example 32

This example includes the elements according to any one of examples 27 to 30, wherein the protocol buffer is a first in-first out (FIFO) buffer.

Example 33

This example includes the elements according to any one of examples 27 to 30, wherein the communication protocol-specific data further includes at least one of a checksum and/or a cyclic redundancy check (CRC).

Example 34

This example includes the elements according to any one of examples 27 to 30, wherein the functional test controller is on die.

Example 35

This example includes the elements of example 33, wherein the communication protocol-specific data further includes link management information.

Example 36

This example includes the elements of example 35, wherein the link management information includes one or more of a training sequence, a credit exchange packet, an acknowledgement (ACK) and/or a non-acknowledgement (NACK) handshake and/or an isochronous time management packet (ITP).

Example 37

This example includes the elements according to any one of examples 27 to 30, wherein the controller logic is to provide a plurality of packets to the I/O controller under test at a rate greater than or equal to 500 megabits per second (Mbps).

Example 38

This example includes the elements according to any one of examples 27 to 30, wherein the functional test controller further includes a control register configured to program an initial seed for the PRBS generator.

Example 39

This example includes the elements according to any one of examples 27 to 30, further including a multiplexer to select the functional test controller during receive testing or to select a physical layer interface (PHY).

Example 40

According to this example, there is provided a system. The system includes at least one device arranged to perform the method of any one of examples 14 to 26.

Example 41

According to this example, there is provided a device. The device includes means to perform the method of any one of examples 14 to 26.

Example 42

According to this example, there is provided a computer readable storage device. The computer readable storage device has stored thereon instructions that when executed by one or more processors result in the following operations including: the method according to any one of examples 14 to 26.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
    a functional test controller in an input/output (I/O) controller under test comprising:
        controller logic to receive communication protocol-specific data comprising a packet header from a tester communicatively coupled to the I/O controller under test;
        a protocol buffer to store the packet header; and
        a pseudorandom bit sequence (PRBS) generator to generate a PRBS,
        the controller logic to combine the packet header and the PRBS into a packet and to provide the packet to the I/O controller under test.

2. The apparatus of claim 1, wherein the communication protocol is selected from the group comprising a Universal Serial Bus (USB) protocol, a Peripheral Component Interconnect Express (PCIe) protocol, a Camera Serial Interface (CSI) protocol, a Universal Flash Storage (UFS) protocol and a Serial AT Attachment (SATA) protocol.

3. The apparatus of claim 1, wherein the PRBS generator is a linear feedback shift register (LFSR).

4. The apparatus of claim 1, wherein the functional test controller further comprises a logical idle generator to generate logical idle data for provision to the I/O controller when packets are not being provided to the I/O controller.

5. The apparatus of claim 1, wherein the controller logic is to provide back to back packets to the I/O controller without logical idles between consecutive packets.

6. The apparatus of claim 1, wherein the protocol buffer is a first in-first out (FIFO) buffer.

7. The apparatus of claim 1, wherein the communication protocol-specific data further comprises at least one of a checksum and/or a cyclic redundancy check (CRC).

8. A method comprising:
    receiving, by controller logic in an input/output (I/O) controller under test, the communication protocol-specific data from a tester communicatively coupled to the I/O controller under test, the communication protocol-specific data comprising a packet header;
    storing, by a protocol buffer, the packet header;
    generating, by a pseudorandom bit sequence (PRBS) generator, a PRBS;
    combining, by the controller logic, the packet header and the PRBS into a packet; and
    providing, by the controller logic, the packet to an input/output (I/O) controller under test.

9. The method of claim 8, wherein the communication protocol is selected from the group comprising a Universal Serial Bus (USB) protocol, a Peripheral Component Interconnect Express (PCIe) protocol, a Camera Serial Interface (CSI) protocol, a Universal Flash Storage (UFS) protocol and a Serial AT Attachment (SATA) protocol.

10. The method of claim 8, wherein the PRBS generator is a linear feedback shift register (LFSR).

11. The method of claim 8, further comprising generating, by a logical idle generator, logical idle data for provision to the I/O controller when packets are not being provided to the I/O controller.

12. The method of claim 8, further comprising providing, by the controller logic, back to back packets to the I/O controller without logical idles between consecutive packets.

13. The method of claim 8, wherein the protocol buffer is a first in-first out (FIFO) buffer.

14. The method of claim 8, wherein the communication protocol-specific data further comprises at least one of a checksum and/or a cyclic redundancy check (CRC).

15. A system comprising:
    a functional test controller an input/output (I/O) controller under test; and
    a tester communicatively coupled to the I/O controller under test, the tester comprising a processor, a memory comprising test data, and test logic to provide communication protocol-specific data comprising a packet header to the functional test controller,
    the functional test controller comprising:
        controller logic to receive the communication protocol-specific data from the tester,
        a protocol buffer to store the packet header, and
        a pseudorandom bit sequence (PRBS) generator to generate a PRBS,
        the controller logic to combine the packet header and the PRBS into a packet and to provide the packet to an input/output (I/O) controller under test.

16. The system of claim 15, wherein the communication protocol is selected from the group comprising a Universal Serial Bus (USB) protocol, a Peripheral Component Interconnect Express (PCIe) protocol, a Camera Serial Interface (CSI) protocol, a Universal Flash Storage (UFS) protocol and a Serial AT Attachment (SATA) protocol.

17. The system of claim 15, wherein the PRBS generator is a linear feedback shift register (LFSR).

18. The system of claim 15, wherein the functional test controller further comprises a logical idle generator to generate logical idle data for provision to the I/O controller when packets are not being provided to the I/O controller.

19. The system of claim 15, wherein the controller logic is to provide back to back packets to the I/O controller without logical idles between consecutive packets.

20. The system of claim 15, wherein the protocol buffer is a first in-first out (FIFO) buffer.

21. The system of claim 15, wherein the communication protocol-specific data further comprises at least one of a checksum and/or a cyclic redundancy check (CRC).

* * * * *